(12) United States Patent
Murata (10) Patent No.: US 7,527,505 B2
(45) Date of Patent: May 5, 2009

(54) SEMICONDUCTOR DEVICE CONTACT RESISTANT TO DETERIORATION DUE TO HEAT AND METHOD FOR MANUFACTURING CONTACT

(75) Inventor: Shinji Murata, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 8 days.

(21) Appl. No.: 11/825,192

(22) Filed: Jul. 3, 2007

(65) Prior Publication Data

US 2008/0032519 A1 Feb. 7, 2008

(30) Foreign Application Priority Data

Aug. 3, 2006 (JP) ............... 2006-211791

(51) Int. Cl.
*H01R 12/00* (2006.01)
(52) U.S. Cl. ...................................... 439/81
(58) Field of Classification Search ............. 439/81, 439/66, 161, 50, 51, 52, 53
See application file for complete search history.

(56) References Cited

U.S. PATENT DOCUMENTS

| | | | | |
|---|---|---|---|---|
| 3,174,851 | A | * | 3/1965 | Buchler et al. ............... 148/426 |
| 4,639,060 | A | * | 1/1987 | Lionnet ....................... 439/161 |
| 4,821,147 | A | * | 4/1989 | Jacobs et al. ................. 361/707 |
| 4,846,709 | A | * | 7/1989 | Kobayashi et al. ........... 439/161 |
| 4,864,824 | A | * | 9/1989 | Gabriel et al. ................. 60/527 |
| 4,950,173 | A | * | 8/1990 | Minemura et al. ............. 439/82 |
| 4,969,835 | A | * | 11/1990 | Kobayashi et al. ........... 439/161 |
| 5,071,064 | A | * | 12/1991 | AbuJudom et al. ........... 236/1 G |
| 5,176,544 | A | * | 1/1993 | AbuJudom et al. ........... 439/878 |
| 5,182,910 | A | * | 2/1993 | Benecke ....................... 60/529 |
| 5,273,441 | A | * | 12/1993 | Volz et al. ..................... 439/72 |
| 5,325,880 | A | * | 7/1994 | Johnson et al. ................. 137/1 |
| 5,410,290 | A | * | 4/1995 | Cho ........................... 337/140 |
| 5,482,467 | A | * | 1/1996 | Nolf et al. .................... 439/161 |
| 5,806,181 | A | * | 9/1998 | Khandros et al. ............. 29/874 |
| 5,903,099 | A | * | 5/1999 | Johnson et al. ............. 313/495 |
| 5,977,858 | A | * | 11/1999 | Morgen et al. .............. 337/140 |
| 5,984,258 | A | * | 11/1999 | Knebel et al. .................. 251/11 |
| 6,226,992 | B1 | * | 5/2001 | Kutlucinar et al. ............ 60/528 |
| 6,239,685 | B1 | * | 5/2001 | Albrecht et al. ............. 337/365 |

(Continued)

FOREIGN PATENT DOCUMENTS

JP 2005-050598 2/2005

*Primary Examiner*—T C Patel
*Assistant Examiner*—Vladimir Imas
(74) *Attorney, Agent, or Firm*—Beyer Law Group LLP (57) ABSTRACT

A Contact according to an aspect of the present invention is formed by laminating a shape memory alloy film on a surface of a metal spring film, and the shape thereof is a conical spiral. A manufacturing method therefor is composed of 11 steps including a step of preparing a sacrificial metal film, a step of forming a resist cone, a step of patterning a resist film, a step of preparing a shape memory alloy film, and the like. Since an organic resist material has poor heat resistance, the sacrificial metal film is formed in advance, the resist is removed before sputtering of the shape memory alloy film, the sacrificial metal film is removed after sputtering of a shape memory alloy and a heat treatment, which are performed at high temperatures, so as to lift off an excess shape memory alloy film.

6 Claims, 6 Drawing Sheets

U.S. PATENT DOCUMENTS

| | | | |
|---|---|---|---|
| 6,239,686 B1 * | 5/2001 | Eder et al. | 337/382 |
| 6,294,977 B1 * | 9/2001 | Kalapodis et al. | 337/140 |
| 6,323,459 B1 * | 11/2001 | Maynard | 219/209 |
| 6,342,826 B1 * | 1/2002 | Quinn et al. | 337/300 |
| 6,358,380 B1 * | 3/2002 | Mann et al. | 204/192.2 |
| 6,402,906 B1 * | 6/2002 | Pichulo et al. | 204/192.15 |
| 6,427,712 B1 * | 8/2002 | Ashurst | 137/62 |
| 6,464,844 B1 * | 10/2002 | Pichulo et al. | 204/192.15 |
| 6,527,919 B1 * | 3/2003 | Roth | 204/192.15 |
| 6,544,056 B1 * | 4/2003 | Roth et al. | 439/161 |
| 6,592,724 B1 * | 7/2003 | Rasmussen et al. | 204/192.15 |
| 6,596,132 B1 * | 7/2003 | Rasmussen et al. | 204/192.15 |
| 6,672,876 B1 | 1/2004 | Takekoshi | |
| 6,689,486 B2 * | 2/2004 | Ho et al. | 428/610 |
| 6,691,977 B2 * | 2/2004 | Knebel et al. | 251/11 |
| 6,724,203 B1 * | 4/2004 | Goldmann et al. | 324/754 |
| 6,761,420 B2 * | 7/2004 | Maluf et al. | 303/119.2 |
| 6,790,298 B2 * | 9/2004 | Johnson et al. | 148/561 |
| 6,812,820 B1 * | 11/2004 | Fouillet | 337/333 |
| 6,849,085 B2 * | 2/2005 | Marton | 623/1.13 |
| 6,860,419 B2 * | 3/2005 | Simon | 228/234.3 |
| 6,915,633 B2 * | 7/2005 | Kutlucinar | 60/527 |
| 6,938,416 B1 * | 9/2005 | Kutlucinar | 60/528 |
| 6,946,040 B2 * | 9/2005 | Homma | 148/563 |
| 6,969,920 B1 * | 11/2005 | Severinghaus | 290/1 R |
| 6,990,811 B2 * | 1/2006 | Starkweather et al. | 60/527 |
| 7,011,378 B2 * | 3/2006 | Maluf et al. | 303/119.2 |
| 7,040,323 B1 * | 5/2006 | Menchaca et al. | 128/833 |
| 7,118,656 B2 * | 10/2006 | Roth | 204/192.15 |
| 7,131,848 B2 | 11/2006 | Lindsey et al. | |
| 7,207,816 B1 * | 4/2007 | Friske | 439/161 |
| 7,335,426 B2 * | 2/2008 | Marton et al. | 428/544 |

* cited by examiner

SEMICONDUCTOR DEVICE CONTACT RESISTANT TO DETERIORATION DUE TO HEAT AND METHOD FOR MANUFACTURING CONTACT

CLAIM OF PRIORITY

This application claims benefit of the Japanese Patent Application No. 2006-211791 filed on Aug. 3, 2006, which is hereby incorporated by reference.

BACKGROUND OF THE INVENTION

1. Field of the Invention

The present invention relates to a contact and a method for manufacturing the contact. In particular, the present invention relates to a contact suitable for use in electrical connection to a semiconductor device having bumps (protrusion electrodes) formed into the shape of a sphere or a land, as well as a method for manufacturing the contact.

2. Description of the Related Art

In general, in a manufacturing process of a semiconductor device, e.g., an integrated circuit (IC) or large scale integration (LSI: IC in which the degree of integration of elements is 1,000 to 10,000), a produced semiconductor device is connected to an inspection wiring board called a probe card and thereby, the semiconductor device is subjected to an electric signal input/output inspection. Consequently, an expense in time and effort for incorporating a defective semiconductor device into a package is reduced.

In a prove card for inspecting a semiconductor device of ball grid array (BGA) system or a semiconductor device of land grid array system, an inspection wiring for passing an electric signal is disposed on the substrate and, in addition, conical contacts having an outer diameter of a few tens of micrometers and having a center portion serving as a top portion are connected to connection terminals of the inspection wiring disposed at a narrow pitch of a few tens of micrometers, so as to be connected to a plurality of spherical bumps (protrusion electrodes) disposed at a narrow pitch of a few tens of micrometers on the semiconductor device or land-shaped bumps having a width of a few tens of micrometers.

This known contact is formed by patterning a conical spiral metal film through the use of an organic resist material and plating a metal, e.g., Cu and Au, having good electrical conductivity on the surface of the metal film.

However, the electric signal input/output inspection of the semiconductor device is a burn-in test in which the temperature (about 120° C.) is higher than the usual working temperature of the semiconductor device and a voltage higher than the usual working voltage is supplied. Therefore, when the burn-in test is repeated, slip deformation which becomes a cause of permanent deformation tends to occur. Consequently, there is a problem in that the permanent set in the shape of the contact occurs in a direction in which an appropriate pressure is not applied to the bump.

Here, it is thought that good properties will be exhibited by using a shape memory alloy having excellent shape recovery property and excellent heat resistance as the contact. However, the shape memory alloy cannot be formed by plating. Although a shape memory alloy film can be formed by sputtering the shape memory alloy, when etching is performed to obtain a desired shape after the sputtering is performed, since the etching resistance of the material for the contact is low with respect to the etching solution of the shape memory alloy, there is a disadvantage that the contact is also removed by etching during the etching of the shape memory alloy. Furthermore, when lift-off by using a resist is intended, sputtering and a heat treatment of the shape memory alloy must be performed under a high temperature environment at about 200° C. to 500° C. Consequently, even when patterning is performed by using an organic resist material, a contact having a desired shape cannot be obtained because the organic resist material cannot endure the high temperature environment.

SUMMARY OF THE INVENTION

The present invention has been made in consideration of the above-described points. Accordingly, the present invention provides a contact capable of preventing permanent set of the shape thereof due to repetition of a burn-in test.

Furthermore, the present invention provides a method for manufacturing a contact capable of preventing permanent set thereof due to repetition of a burn-in test.

According to the present invention, a first aspect of the contact includes a metal spring film formed into the shape of a conical spiral or a pyramidal spiral and a shape memory alloy film which is disposed on a surface of the metal spring film and which has a martensite transformation temperature higher than room temperature and a reverse martensite transformation temperature lower than a test temperature of a burn-in test.

According to the first aspect of the contact, even when a stress is applied to the contact under an environment at room temperature to a test temperature and the contact is deformed, since the shape memory alloy film of the contact is a martensite phase at room temperature and is an austenite phase (parent phase) at the test temperature of the burn-in test, the shape memory alloy film exerts a shape memory effect and superelasticity under the test temperature environment, so that the deformation of the contact can be recovered. Furthermore, since the metal spring film is formed into the shape of a spiral cone in which the center portion serves as a top portion, when a bump comes into contact, an oxide film of the bump can be cut by the contact formed into the shape of a spiral cone while the spiral shape is extended.

A second aspect of the contact in the present invention is the contact according to the first aspect, wherein the metal spring film is formed by using a Ni—X alloy (X is any one element of P, W, Mn, Ti, and Be).

According to the second aspect of the contact, since the Ni—X alloy (X is any one element of P, W, Mn, Ti, and Be) exerts a large elastic force, a large pressure can be applied to the oxide film of the bump, as compared with other metal spring films formed by using other metals.

A third aspect of the contact in the present invention is the contact according to the first or the second aspect, wherein the shape memory alloy film is formed by using a TiNi alloy.

According to the third aspect of the contact, the TiNi alloy can exert a stable shape memory effect and superelasticity as compared with those of other shape memory alloys.

A fourth aspect of the contact in the present invention is the contact according to the third aspect, wherein the composition of a Ti site in the TiNi alloy is 50.0 to 51.0 percent by mole.

According to the fourth aspect of the contact, in the case where the composition of the Ti site is 50.0 to 51.0 percent by mole, since the martensite transformation temperature thereof can be made about 80° C., the shape memory alloy film can exert a good shape memory effect at room temperature at which the semiconductor device is mounted. Furthermore, since the reverse martensite transformation temperature (austenite transformation temperature) thereof can be made about 100° C., the shape memory alloy film can exert good superelasticity under the test environment (about 120° C.) of the burn-in test.

A fifth aspect of the contact in the present invention is the contact according to any one of the first to the fourth aspects, wherein the metal spring film is laminated on a surface of a seed film laminated on a surface of an insulating substrate used for a wiring board or a surface of a connection terminal disposed on the wiring board, and the seed film is formed by laminating a Cu layer on a Ti layer or a Cr layer.

According to the fifth aspect of the contact, the Ti layer and the Cr layer exhibit good adhesion to the insulating substrate and the connection terminal, and the Cu layer exhibits good adhesion to the Ti layer or the Cr layer under the Cu layer and the metal spring film of a Ni—X alloy (X is any one element of P, W, Mn, Ti, and Be) or the like. Therefore, peeling of the contact from the wiring board can be prevented.

A sixth aspect of the contact in the present invention is the contact according to any one of the first to the fifth aspects, including an auxiliary electrically conductive film disposed by laminating a Ni—X alloy (X is any one element of P, W, Mn, Ti, and Be) on a surface of the shape memory alloy film and an electrically conductive film formed by laminating Au on a surface of the auxiliary electrically conductive film.

According to the sixth aspect of the contact, since the electrically conductive film has a high electrical conductivity, the electrical conductivity of the contact can be increased. Furthermore, the auxiliary electrically conductive film serving as a substrate of the electrically conductive film is formed by using the Ni—X alloy and has a large elastic force. Therefore, the auxiliary electrically conductive film can also be used as an auxiliary film of the metal spring film.

A first aspect of the method for manufacturing a contact in the present invention includes a first step of forming a sacrificial metal film on a surface of an insulating substrate used for a wiring board and a surface of a connection terminal disposed on the wiring board and patterning the sacrificial metal film with a groove in the shape of an annular ring or a polygonal ring, so as to expose the connection terminal at a surface of the groove in the shape of an annular ring or a polygonal ring, a second step of patterning the circular or polygonal sacrificial metal film disposed inside the groove in the shape of an annular ring or a polygonal ring with a resist cone in the shape of a circular cone or a pyramid, a third step of sputtering a metal after the patterning of the resist cone, so as to form a seed film on surfaces of the resist cone, the groove in the shape of an annular ring or a polygonal ring, and sacrificial metal film disposed outside the groove in the shape of an annular ring or a polygonal ring, a fourth step of forming a resist film on a surface of the seed film and, thereafter, patterning the resist film with a conical spiral or pyramidal spiral groove, in which the center is the top of the resist cone and the circumference of the bottom is the groove in the shape of an annular ring or a polygonal ring, a fifth step of electroplating the seed film disposed in the inside of the conical spiral or pyramidal spiral groove, so as to form a metal spring film in the conical spiral or pyramidal spiral groove, a sixth step of removing the resist film after the metal spring film is formed, a seventh step of removing the seed film exposed at the surface after the resist film is removed, an eighth step of removing the resist cone after the seed film is removed, a ninth step of sputtering a shape memory alloy having a martensite transformation temperature higher than room temperature and a reverse martensite transformation temperature lower than a test temperature of a burn-in test after the resist cone is removed, so as to form a shape memory alloy film on surfaces of the metal spring film and the sacrificial metal film, which are exposed at surfaces, a ten-Ath step of subjecting the shape memory alloy film to a heat treatment for performing a shape memory treatment, and an eleven-Ath step of removing the sacrificial metal film after the heat treatment of the shape memory alloy film is performed, so as to remove together the shape memory alloy film disposed on the surface of the sacrificial metal film.

According to the first aspect of the method for manufacturing a contact, since the metal spring film serving as a structural material is formed by electroplating, the film thickness thereof is easily controlled. Furthermore, since the shape memory alloy film is formed by sputtering, the composition thereof is easily controlled. Consequently, when the contact comes into contact with the bump, a desired pressure can be applied to the bump and, in addition, the contact is allowed to exert the shape memory effect and the superelasticity stably. Furthermore, according to the first aspect of the method for manufacturing a contact, since the sacrificial metal film having excellent heat resistance is disposed as the resist film, in contrast to an organic resist material having poor heat resistance, an excess shape memory alloy film can be easily peeled off (lift off) together with the sacrificial metal film even after the heat treatment of the shape memory alloy film.

A second aspect of the method for manufacturing a contact in the present invention is the method for manufacturing a contact according to the first aspect, wherein the metal spring film is formed by using a Ni—X alloy (X is any one element of P, W, Mn, Ti, and Be).

According to the second aspect of the method for manufacturing a contact, since the film thickness of the metal spring film can be increased relatively easily by Ni—X alloy plating and the Ni—X alloy has a large elastic force, a large pressure can be applied to the bump and the oxide film as compared with metal spring films formed by using other metals.

A third aspect of the method for manufacturing a contact in the present invention is the method for manufacturing a contact according to the first or second aspect, wherein the shape memory alloy film is formed by using a TiNi alloy.

According to the third aspect of the method for manufacturing a contact, the TiNi alloy can exert a shape memory effect and superelasticity stably as compared with those of other shape memory alloys.

A fourth aspect of the method for manufacturing a contact in the present invention is the method for manufacturing a contact according to the third aspect, wherein the composition of a Ti site in the TiNi alloy is 50.0 to 51.0 percent by mole.

According to the fourth aspect of the method for manufacturing a contact, in the case where the composition of a Ti site in the TiNi alloy is 50.0 to 51.0 percent by mole, since the martensite transformation temperature thereof can be made about 80° C., the shape memory alloy film can exert a good shape memory effect at room temperature at which the semiconductor device is mounted. Furthermore, since the reverse martensite transformation temperature (austenite transformation temperature) can be made about 100° C., the shape memory alloy film can exert good superelasticity under the test environment (about 120° C.) of the burn-in test. Moreover, although the shape memory alloy is sensitive to the composition, even when the composition is deviated to some extent by sputtering, the transformation temperature thereof is not changed, insofar as the composition of the Ti site is 50.0 to 51.0 percent by mole. Consequently, shape memory alloy films having equivalent properties can be formed repeatedly.

A fifth aspect of the method for manufacturing a contact in the present invention is the method for manufacturing a contact according to any one of the first to the fourth aspects, wherein the seed film is formed by laminating a Cu layer on a Ti layer or a Cr layer.

According to the fifth aspect of the method for manufacturing a contact, the Ti layer and the Cr layer exhibit good adhesion to the insulating substrate and the connection terminal, and the Cu layer exhibits good adhesion to the Ti layer or the Cr layer under the Cu layer and the metal spring film of a Ni—X alloy or the like. Therefore, peeling of the contact from the wiring board can be prevented.

A sixth aspect of the method for manufacturing a contact in the present invention is the method for manufacturing a contact according to any one of the first to the fifth aspects, wherein the sacrificial metal film is formed by laminating a Cu layer on a Cr layer.

According to the sixth aspect of the method for manufacturing a contact, the etching rates of the Cr layer and the Cu layer can be made larger than the etching rates of the metal spring film and the shape memory alloy film by using an etching solution for Cr and an etching solution for Cu. Therefore, the sacrificial metal film can be etched without exerting an influence on the seed film, the metal spring film, and the shape memory alloy film.

A seventh aspect of the method for manufacturing a contact in the present invention is the method for manufacturing a contact according to any one of the first to the sixth aspects, wherein the viscosity of a resist material used for the resist cone is higher than the viscosity of the resist material used for the resist film.

According to the seventh aspect of the method for manufacturing a contact, since the resist cone is a three-dimensional shape and is formed into a conical shape or a pyramidal shape, when the resist cone has a viscosity higher than the viscosity of the resist film, the resist cone can be patterned easily.

An eighth aspect of the method for manufacturing a contact in the present invention is the method for manufacturing a contact according to any one of the first to the seventh aspects, including a ten-Bth step of sputtering a Ni—X alloy (X is any one element of P, W, Mn, Ti, and Be) after the ten-Ath step and before the eleven-Ath step, so as to form an auxiliary electrically conductive film on a surface of the shape memory alloy film and an eleven-Bth step of substituting Au for Ni of the auxiliary electrically conductive film after the eleven-Ath step, so as to form an electrically conductive film on a surface of the auxiliary electrically conductive film.

According to the eighth aspect of the method for manufacturing a contact, since an electrically conductive Au film is disposed by substitution on a surface of the auxiliary electrically conductive film serving as a substrate after removal of the sacrificial metal film, the electrical conductivity of the contact can be improved without removing Au uselessly. Furthermore, the auxiliary electrically conductive film is formed by using the Ni—X alloy, and the elastic force thereof is large. Therefore, the auxiliary electrically conductive film can also be used as an auxiliary film of the metal spring film.

According to the contact of the present invention, plastic deformation (twinning deformation) generated in the contact can be recovered by heating at a temperature higher than or equal to the reverse martensite transformation temperature or unloading of a load due to contact between the contact and the bump. Therefore, an effect of preventing occurrence of permanent set of the contact through permanent deformation due to repetition of the burn-in test can be exerted.

According to the method for manufacturing a contact of the present invention, the contact is formed by laminating the shape memory alloy film having an excellent shape recovery property on the surface of the metal spring film having a predetermined film thickness, and the shape memory alloy film is patterned by using the sacrificial metal film having the excellent heat resistance. Therefore, an effect of producing a contact, which does not cause permanent set even when the burn-in test is repeated, can be exerted.

BRIEF DESCRIPTION OF THE DRAWINGS

FIG. 4A shows the ten-Bth step, and FIG. 4B shows the eleven-Bth step;

DESCRIPTION OF THE PREFERRED EMBODIMENTS

A contact according to an embodiment of the present invention will be described below with reference to FIG. 1 and FIG. 2.

Figure 1:
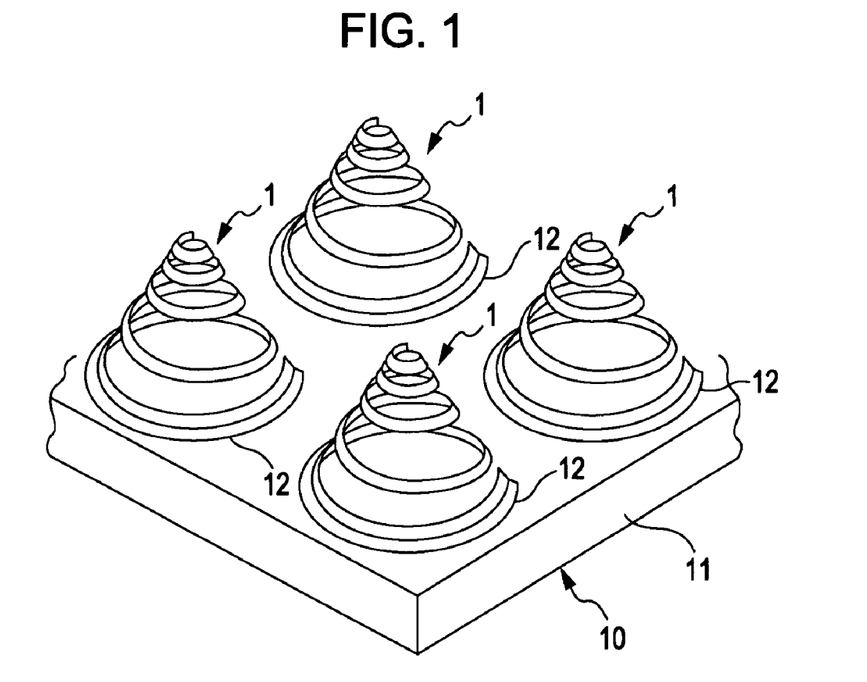
FIG. 1 is a perspective view showing a contact of the present embodiment.

FIG. 1 is a perspective view showing a contact 1 of the present embodiment. FIG. 2 is a vertical sectional view showing the contact 1 of the present embodiment. As shown in FIG. 1, the contact 1 of the present embodiment is formed into the shape of a conical spiral, in which the center portion serves as a top portion, and is connected to a connection terminal 12 disposed on an insulating substrate 11 of a probe card (inspection wiring board) 10. As shown in FIG. 2, this contact 1 is formed by laminating a metal spring film 2 and a shape memory alloy film 3. Furthermore, the contact 1 of the present embodiment is formed by laminating a seed film 4, an auxiliary electrically conductive film 5, and an electrically conductive film 6 at their respective predetermined locations as auxiliary films of the metal spring film 2 and the shape memory alloy film 3.

The metal spring film 2 is formed into the shape of a conical spiral, in which the center portion serves as a top portion, the diameter thereof is about 200 μm, and the height thereof is about 100 μm. The metal spring film 2 may be formed by using any metal, insofar as the metal is resistant to occurrence of slip deformation which becomes a cause of permanent deformation. In the present embodiment, a nickel-phosphorous (Ni—P) alloy, which is one type of Ni—X alloys (X is any one element of P, W, Mn, Ti, and Be) exhibiting a large elastic force, is used, and the film thickness thereof is made to become about 10 to 30 µm.

The shape memory alloy film 3 is formed on a surface of the metal spring film 2 by sputtering through the use of a shape memory alloy having a martensite transformation temperature (Ms point) higher than room temperature (for example, about 25° C.) and a reverse martensite transformation temperature (austenite transformation temperature, Af point) set at a temperature lower than the test temperature (for example, about 120° C.) of the burn-in test. For the shape memory alloy film 3 of the present embodiment, a TiNi alloy (a TiNi binary alloy in the present embodiment, and besides TiNi binary alloys, TiNi based alloys, e.g., TiNiZr and TiNiCu, are also included) is used, and the film thickness thereof is made to become about 6 µm. With respect to the TiNi alloy among various shape memory alloys, twinning deformation occurs most stably and the shape can be recovered. The composition of a Ti site (a total composition of the composition of Ti and the composition of element to substitute for Ti, and the composition of Ti in the present embodiment) is set at 50.0 to 51.0 percent by mole and, therefore, the TiNi alloy is Ti rich. Consequently, the martensite transformation temperature thereof is about 80° C., and the reverse martensite transformation temperature, that is, the austenite transformation temperature, is about 100° C.

The seed layer 4 is laminated between the insulating substrate 11 or the connection terminal 12 and the metal spring film 2. This seed film 4 is used in the formation of the metal spring film 2 and, in addition, is also used as an adhesion film between the insulating substrate 11 or the connection terminal 12 and the metal spring film 2. Therefore, the seed film 4 of the present embodiment is formed by allowing a Ti layer or Cr layer to serve as a first layer and laminating a Cu layer serving as a second layer on a surface of the first layer.

The auxiliary electrically conductive film 5 is formed on a surface of the shape memory alloy film 3 by laminating a Ni—P alloy, which is one type of Ni—X alloys (X is any one element of P, W, Mn, Ti, and Be) in such a way that the film thickness becomes about 2 µm. The electrically conductive film 6 is formed on a surface of the auxiliary electrically conductive film 5 by laminating Au in such a way that the film thickness becomes about 0.3 µm.

FIGS. 3A to 3j are vertical sectional views showing a method for manufacturing the contact 1 of the present embodiment. As shown in FIGS. 3A to 3J, the method for manufacturing the contact 1 of the present embodiment includes each of the first step to the eleventh step as main steps.

Figure 3A:
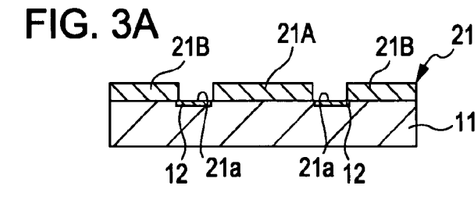
FIGS. 3A to 3J are vertical sectional views showing a method for manufacturing a contact of the present embodiment performed in the order of steps shown in FIG. 3A to FIG. 3J.

In the first step, as shown in FIG. 3A, the sacrificial metal film 21 is formed on the insulating substrate 11 and the connection terminal 12 of the probe card 10. The sacrificial metal film 21 of the present embodiment is formed by forming a Cr layer having a thickness of 15 nm by sputtering, and laminating a Cu layer having a thickness of 1 µm on a surface of the Cr layer by sputtering. The sacrificial metal film 21 is patterned with a groove 21a in the shape of an annular ring. The patterning refers to that a resist material is applied, exposure is performed after a resist portion to be left or a resist portion not to be left is masked, development is performed with an etching solution, so as to etch the resist material. The connection terminal 12 is exposed at the groove 21a in the shape of an annular ring by the above-described patterning.

Figure 3B:
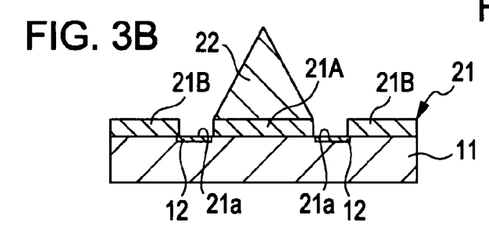

In the second step, as shown in FIG. 3B, a cylindrical resist body is formed on the circular sacrificial metal film 21A disposed inside the groove 21a in the shape of an annular ring. The cylindrical resist body is coated with a resist, multiple exposure is performed, followed by development, so as to pattern the resist cone 22 in the shape of a circular cone. A resist material having a viscosity higher than the viscosity of the resist material used for forming the thin film (the resist material used for the following resist film 23, in the present embodiment), specifically a novolac resist material, is selected as the resist material to be used for the resist cone 22.

Figure 3C:
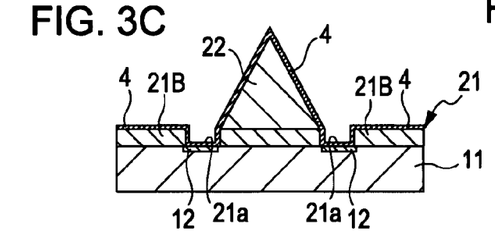

In the third step, as shown in FIG. 3C, after the patterning of the resist cone, a metal having excellent electrical conductivity is sputtered, so as to form a seed film 4 on each of surfaces of the resist cone 22, the groove 21a in the shape of an annular ring, and the sacrificial metal film 21B disposed outside the groove 21a in the shape of an annular ring. This seed film 4 is formed by laminating a Cu layer having a film thickness of about 0.1 µm and serving as a second layer on a Ti layer or Cr layer having a film thickness of about 15 nm and serving as a first layer.

Figure 3D:
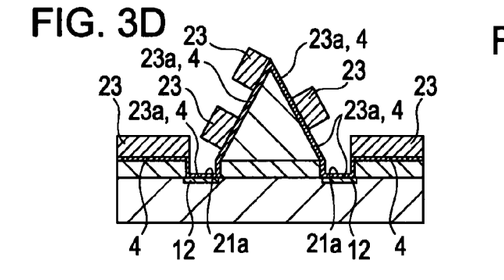

In the fourth step, as shown in FIG. 3D, a resist film 23 is formed on a surface of the seed film 4, and the resist film 23 is patterned with a conical spiral groove 23a. In this conical spiral groove 23a, the center is the top of the resist cone 22, the circumference of the bottom is the groove 21a in the shape of an annular ring, and the seed film 4 formed on the connection terminal 12 is exposed at a surface of the circumference of the bottom (groove 21a in the shape of an annular ring). The resist material for the resist film 23 is a novolac resist material and, as described above, the viscosity thereof is lower than the viscosity of the resist material used for the resist cone 22.

Figure 3E:
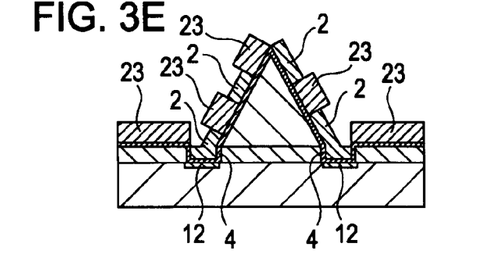

In the fifth step, as shown in FIG. 3E, the seed film 4 is electroplated, so as to form a metal spring film 2 in the conical spiral groove 23a. A Ni—P alloy, which is one type of Ni—X alloys (X is any one element of P, W, Mn, Ti, and Be), is used as this metal spring film 2, and the film thickness thereof is 10 to 30 µm.

Figure 3F:
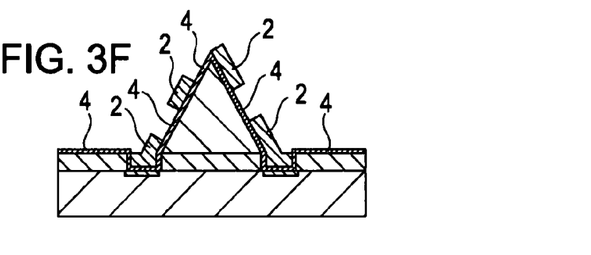

In the sixth step, as shown in FIG. 3F, the resist film 23 is removed after the metal spring film 2 is formed. N-methyl-2-pyrrolidone (molecular formula: $C_5H_9NO$, trade name: NMP) is used as a resist remover.

Figure 3G:
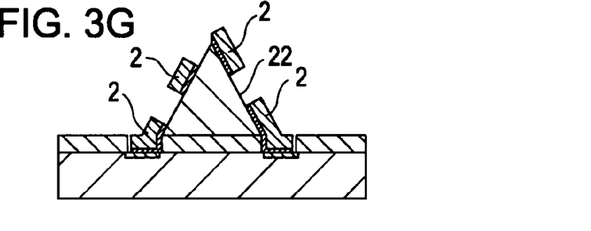

In a seventh step, as shown in FIG. 3G, the seed film 4 exposed at the surface is removed after the resist film 23 is removed. The seed film 4 is removed by ion milling.

Figure 3H:
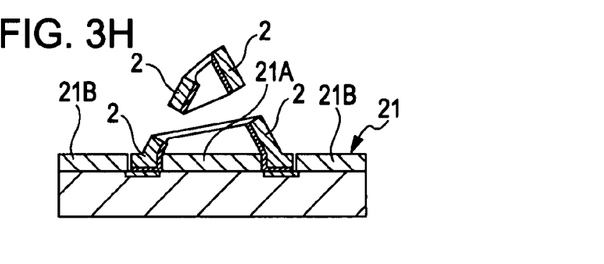

In the eighth step, as shown in FIG. 3H, after the seed film 4 is removed, the resist remover is supplied through the portion, from which the seed film 4 has been removed, so as to remove the resist cone 22. N-methyl-2-pyrrolidone, which is the same resist remover as that used for removing the resist film 23, is used as a resist remover.

Figure 3I:
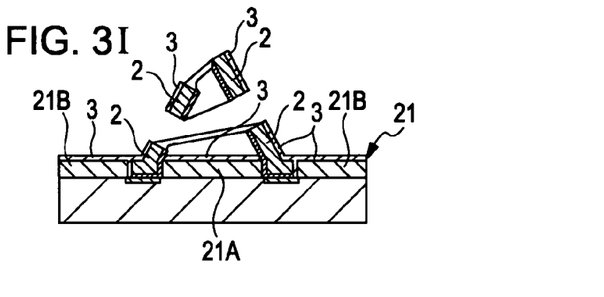

In the ninth step, as shown in FIG. 3I, after the resist cone 22 is removed, a shape memory alloy having a martensite transformation temperature higher than room temperature and a reverse martensite transformation temperature lower than a test temperature of a burn-in test is sputtered, so as to form the shape memory alloy film 3 on surfaces of the metal spring film 2 and the sacrificial metal film 21 exposed at the surface. The shape memory alloy to be sputtered is a TiNi alloy, and the composition of the Ti site in the TiNi alloy is 50.0 to 51.0 percent by mole. With respect to the condition of the sputtering treatment, the heating temperature is 230° C., the Ar gas pressure is 0.46 Pa, and the film thickness of the resulting shape memory alloy film 3 is 6 µm.

In the ten-Ath step, the shape memory alloy film 3 shown in FIG. 3I is subjected to a heat treatment. This heat treatment is a shape memory treatment of the shape memory alloy film 3, and the condition thereof is annealing at 420° C. for 30 minutes.

Figure 3J:
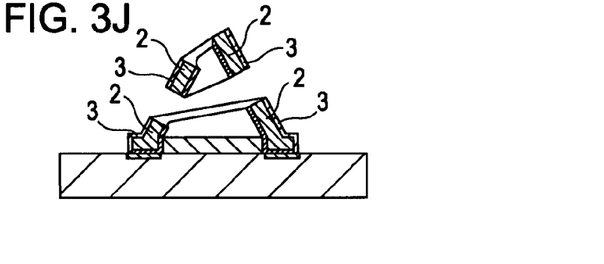

In the eleven-Ath step, as shown in FIG. 3J, the sacrificial metal film 21 is removed (lift-off) after the heat treatment of the shape memory alloy film 3 is performed, so as to remove together the shape memory alloy film 3 disposed on the surface of the sacrificial metal film 21. Since the sacrificial metal film 21 of the present embodiment is produced by laminating the Cu layer on the Cr layer, the Cr layer is lifted off after the Cu layer is lifted off. An aqueous solution produced by adding sulfuric acid to iron(III) sulfate (also known as ferric sulfate, composition formula: $Fe_2(SO_4)_3$) aqueous solution is used as a Cu lift-off agent, and a potassium ferricyanide (molecular formula: $K_3Fe(CN)_6$) aqueous solution is used as a Cr lift-off agent.

Figure 2:
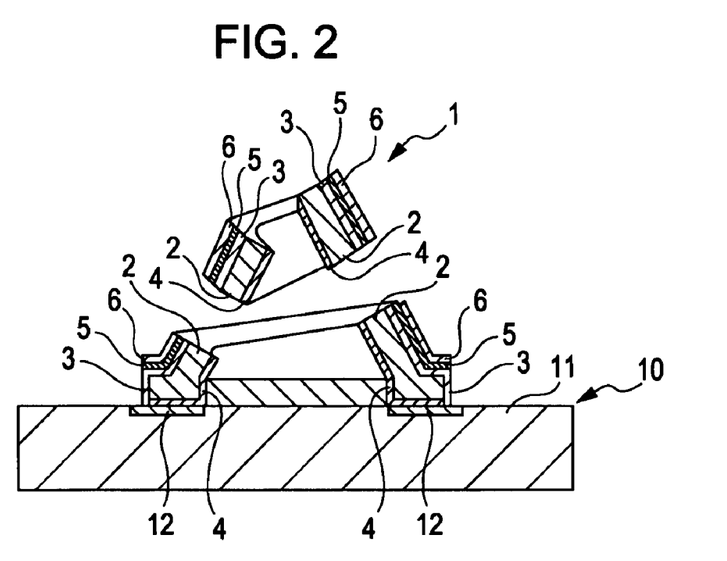
FIG. 2 is a vertical sectional view showing a contact of the present embodiment.
Figure 4A:
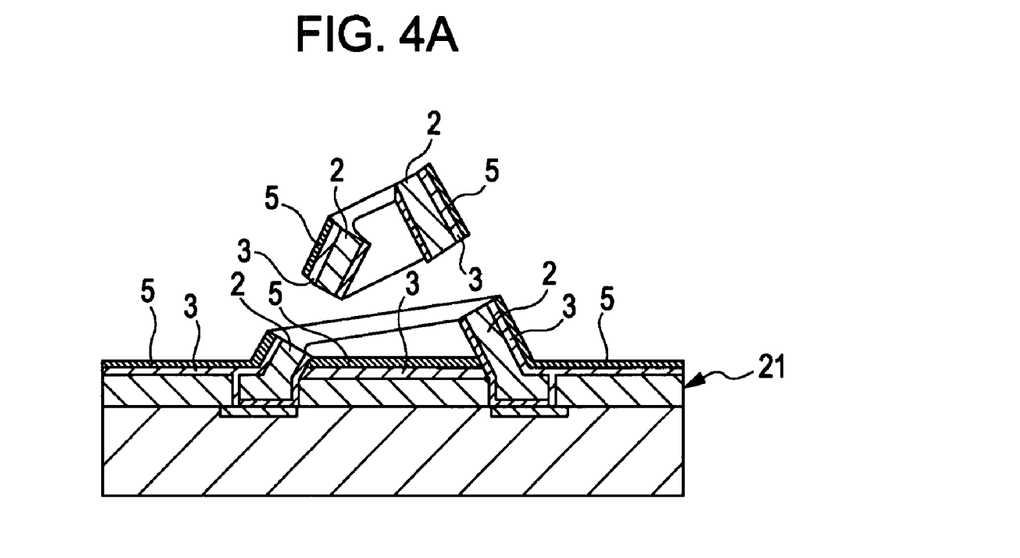
FIGS. 4A and 4B are vertical sectional views showing manufacturing steps of an auxiliary electrically conductive film and an electrically conductive film in a method for manufacturing a contact of the present embodiment.
Figure 4B:
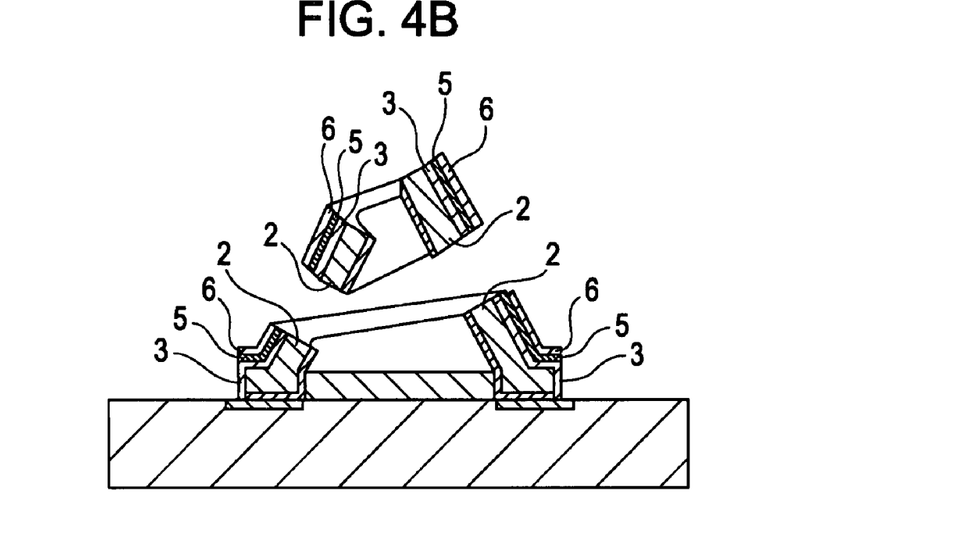

Furthermore, as shown in FIG. 2, since the contact 1 of the present embodiment includes the auxiliary electrically conductive film 5 and the electrically conductive film 6, the method for manufacturing the contact 1 of the present embodiment includes the ten-Bth step and the eleven-Bth step, as shown in FIG. 4A and FIG. 4B, besides the above-described steps.

In the ten-Bth step, as shown in FIG. 4A, a Ni—P alloy, which is one type of Ni—X alloys (X is any one element of P, W, Mn, Ti, and Be) is sputtered after the ten-Ath step and before the eleven-Ath step, that is, after the heat treatment of the shape memory alloy film 3 and before the removal of the sacrificial metal film 21, so as to form the auxiliary electrically conductive film 5 on the shape memory alloy film 3. The resulting auxiliary electrically conductive film 5 serves as a substrate film of plating to substitute Au for Ni to be performed in the downstream. The conditions of the sputtering treatment are 0.1 to 10 Pa and RF 800 W, and the film thickness of the resulting auxiliary electrically conductive film 5 is 2 μm.

In the eleven-Bth step, as shown in FIG. 4B, Au is substituted for Ni of the auxiliary electrically conductive film 5 after the eleven-Ath step, that is, after the removal of the sacrificial metal layer 21, so as to form the electrically conductive film 6 on a surface of the auxiliary electrically conductive film 5. The formation of the electrically conductive film 6 is performed by electroless plating, and the plating solution is Epitas (trade name). The film thickness of the resulting electrically conductive film 6 is 0.3 μm.

Figure 5:
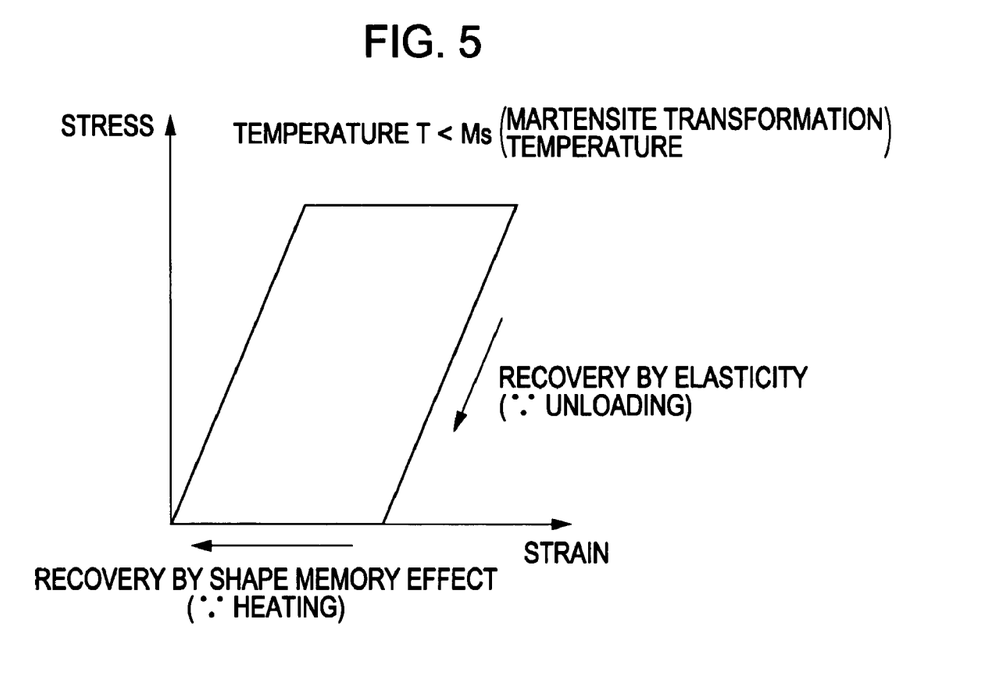
FIG. 5 is a stress-strain diagram of a shape memory alloy film at a temperature lower than or equal to the martensite transformation temperature.
Figure 6:
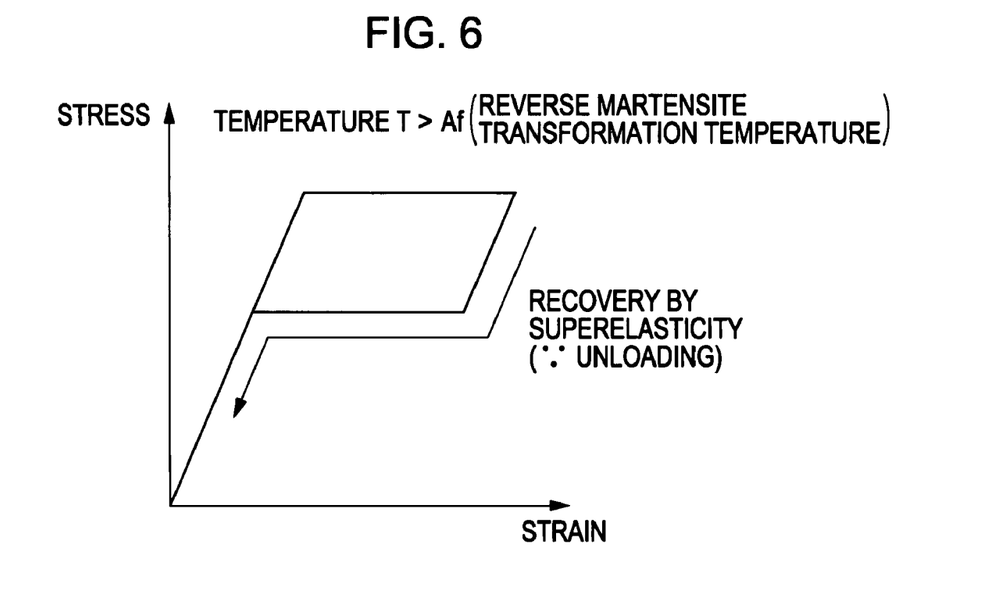
FIG. 6 is a stress-strain diagram of a shape memory alloy film at a temperature higher than or equal to the reverse martensite transformation temperature.
Figure 7:
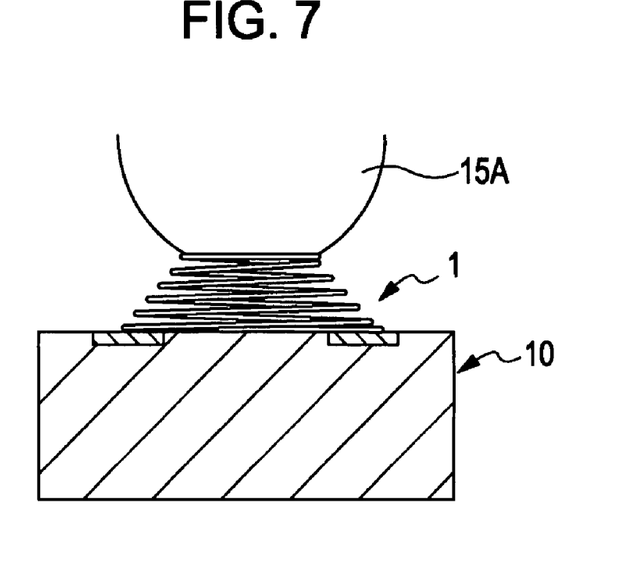
FIG. 7 is a front view showing a state in which a contact of the present embodiment is in contact with a ball-shaped bump and, thereby, a pressure is generated downward.
Figure 8:
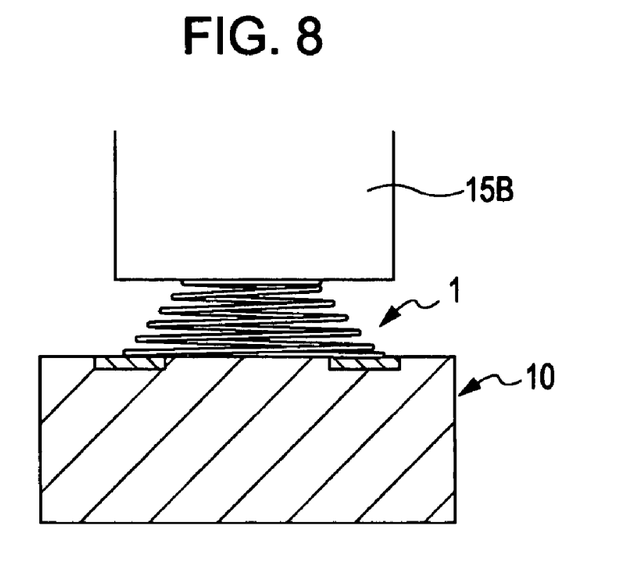
FIG. 8 is a front view showing a state in which a contact of the present embodiment is in contact with a land-shaped bump and, thereby, a pressure is generated downward.

The operations of the contact 1 of the present embodiment and the manufacturing method therefor will be described below with reference to FIG. 1 to FIG. 8. Here, FIG. 5 shows a stress-strain diagram of the shape memory alloy film 3 at a temperature lower than or equal to the martensite transformation temperature, and FIG. 6 shows a stress-strain diagram of the shape memory alloy film 3 at a temperature higher than or equal to the reverse martensite transformation temperature. FIG. 7 and FIG. 8 show the state in which the contact 1 of the present embodiment is in contact with a ball-shaped bump 15A or a land-shaped bump 15B and, thereby, a pressure is generated downward.

In the contact 1 of the present embodiment, the shape memory alloy film 3 is laminated on the surface of the metal spring film 2 in the shape of a conical spiral. The reverse martensite transformation temperature of the shape memory alloy film 3 is set at a temperature lower than the test temperature of the burn-in test (for example, about 120° C.) and higher than room temperature.

As shown in FIG. 5, the shape memory alloy is a martensite phase under an environment at a temperature lower than or equal to the martensite transformation temperature (MS point), and with respect to deformation under that environment (for example, room temperature), a shape memory effect is exerted by heating to a temperature higher than or equal to the reverse martensite transformation temperature (Af point). Furthermore, as shown in FIG. 6, the shape memory alloy is an austenite phase under an environment at a temperature higher than or equal to the reverse martensite transformation temperature, and with respect to deformation under that environment (for example, the test temperature of the burn-in test), superelasticity is exhibited, so that the deformation is recovered by merely unloading. Both are due to the twinning deformation of the shape memory alloy, and slip deformation, which becomes a cause of permanent deformation, does not occur.

Therefore, with respect to the contact 1 of the present embodiment, in the mounting of a semiconductor device to be inspected on the probe card 10 at room temperature, as shown in FIG. 7 or FIG. 8, even when the spiral shape of the contact 1 mounted on the probe card 10 with the bump 15A or 15B of the semiconductor device is deformed in a direction of being extended outward, the deformation can be recovered by the shape memory effect under the test environment of the burn-in test. Even when the contact 1 is deformed under the test environment of the burn-in test, the deformation can be recovered by the superelasticity after a deformation stress is removed.

That is, in the contact 1 of the present embodiment, the slip deformation, which becomes a cause of permanent deformation, does not occur, but the twinning deformation occurs, so that the shape can be recovered by heating or unloading. Consequently, in contrast to a known contact 1, the slip deformation does not occur by repetition of the burn-in test and, therefore, the shape is not changed.

In particular, since the TiNi alloy is used for the shape memory alloy film 3 of the present embodiment, a stable shape memory effect and superelasticity can be exerted as compared with those of other shape memory alloys, e.g., Cu based shape memory alloys and iron based shape memory alloys. Furthermore, since the composition of the Ti site of the TiNi alloy is 50.0 to 51.0 percent by mole, the martensite transformation temperature thereof becomes about 80° C., and a good shape memory effect is exerted at room temperature at which the semiconductor device is mounted. Since the reverse martensite transformation temperature (austenite transformation temperature) thereof becomes about 100° C., good superelasticity can be exerted under the test environment (about 120° C.) of the burn-in test.

In the contact 1 of the present embodiment, as shown in FIG. 1 and FIG. 2, the metal spring film 2 is formed into the shape of a conical spiral, and as shown in FIG. 7 or FIG. 8, when the conical spiral contact 1 comes into contact with the bump 15A or 15B, the conical spiral contact 1 applies pressure to the bump 15A or 15B while extending outward. Consequently, even when an oxide film has been formed on the surface of the bump 15A or 15B, the contact 1 can come into contact with the surface of the bump 15A or 15B while cutting the oxide film. Therefore, the bump 15A or 15B and the contact 1 can be reliably brought into conduction.

Since the center portion of the conical spiral contact 1 constitutes a top portion of the circular cone, a large pressure can be applied to the bump 15A or 15B as compared with a planar spiral contact 1. Moreover, since this metal spring film 2 is formed by using the Ni—P alloy, which is one type of Ni—X alloys (X is any one element of P, W, Mn, Ti, and Be) having a large elastic force, a large pressure can be applied to all bumps 15A and 15B.

When a large pressure is applied to the bump 15A or 15B, a large pressure is also applied to the contact 1. Therefore, not only the deformation is caused, but also peeling between the contact 1 and the probe card 10 results. Consequently, the seed layer 4 serving as an intermediate layer between the probe card 10 and the contact 1 is laminated.

In the seed layer 4 of the present embodiment, the Ti layer or the Cr layer is disposed as a first layer, and the Cu layer is disposed as a second layer. The first layer exhibits good adhesion to the probe card 10 and the connection terminal 12 thereof, and the second layer exhibits good adhesion to the first layer and the metal spring film 2. The seed layer 4 is basically for forming the metal spring film 2 by plating. However, since the seed 4 of the present embodiment also serves as an adhesion film between the probe card 10 and the metal spring film 2, peeling of the contact 1 from the probe card 10 can be prevented even when a large pressure is applied from the bump 15A or 15B to the contact 1.

Furthermore, in the contact 1 of the present embodiment, as shown in FIG. 2, the electrically conductive Au film 6 is disposed on the surface of the auxiliary electrically conductive Ni—P alloy film, the electrically conductive film 6 has a high electrical conductivity and, thereby, the electrical conductivity of the contact 1 can be increased.

This contact 1 is produced through the first step to the eleventh step. According to the fifth step, since the metal spring film 2 serving as a structural material is formed by electroplating, an increase in the film thickness can be controlled easily. According to the ninth step, since the shape memory alloy film 3 is formed by sputtering, the composition thereof can be controlled easily. In this manner, a desired pressure can be applied to the bump 15A or 15B when the contact 1 comes into contact with the bump 15A or 15B. In addition, the shape memory effect and the superelasticity can be exerted stably on all contacts 1 produced.

In the shape memory alloy film 3 of the present embodiment, the TiNi alloy having the Ti site composition of 50.0 to 51.0 percent by mole is used. As described above, with respect to the properties thereof, a stable shape memory effect and superelasticity can be exerted. It is known that the TiNi alloy is an alloy sensitive to the composition, and even when the Ni site composition is 50.0 to 51.0 percent by mole, the transformation temperature varies as much as 100° C. It is also known that when the Ti site composition is 50.0 to 51.0 percent by mole, the transformation temperature is constant. That is, even when the Ti site composition is deviated to some extent by sputtering, the transformation temperature thereof does not vary and shape memory alloy films 3 having equivalent properties can be formed insofar as the Ti composition is within the range of 50.0 to 51.0 percent by mole.

According to the first step, since the resist film 23 is formed from the sacrificial metal film 21 having excellent heat resistance, in contrast to an organic resist material having poor heat resistance, an excess shape memory alloy film 3 can be peeled off (lift off) easily together with the sacrificial metal film 3 even after the heat treatment of the shape memory alloy film 3. Since the sacrificial metal film 21 of the present embodiment is formed by laminating the Cu layer on the Cr layer, the etching rates of the Cr layer and the Cu layer can be made larger than the etching rates of the seed film 4, the metal spring film 2, and the shape memory alloy film 3 by using an etching solution for Cr and an etching solution for Cu. That is, the sacrificial metal film 21 can be etched without exerting an influence on the seed film 4, the metal spring film 2, and the shape memory alloy film 3.

The metal spring film 2 serving as a substrate of the shape memory alloy film 3 is formed by using the Ni—P alloy, which is one type of Ni—X alloys (X is any one element of P, W, Mn, Ti, and Be) having a large elastic force. The film thickness of the metal spring film 2 can be increased by Ni—P alloy plating relatively easily. Since the elastic force of the Ni—P alloy is large, a large pressure can be applied to the bump 15A or 15B and an oxide film thereof as compared with metal spring films 2 formed by using other metals.

The seed layer 4 serving as an intermediate layer between the insulating substrate 11 and the connection terminal 12 of the probe card 10 and the metal spring film 2 is laminated. Since this seed film 4 includes the Cu layer, which is a good conductor, on the surface, the plating treatment of the metal spring film 2 can be performed efficiently. Furthermore, as described above, this seed layer 4 exhibits good adhesion to the insulating substrate 11, the connection terminal 12, and the metal spring film 2. Therefore, peeling of the contact 1 from the probe card 10 can be prevented.

In the method for manufacturing the contact 1 of the present embodiment, the resist cone 22 and the resist film 23 are formed in the second step and the fourth step. Since the resist cone 22 is a three-dimensional shape and is formed into a conical shape, when the resist cone has a viscosity higher than the viscosity of the resist material to be used for the resist film 23, the resist cone 22 can be patterned easily.

With respect to the shape memory alloy film 3 of the present embodiment, the auxiliary electrically conductive Ni—P alloy film 5 is formed on the surface of the shape memory alloy film 3 by sputtering (the ten-Bth step) after the heat treatment of the shape memory alloy film 3 (shape memory treatment), and Au is substituted for Ni of the auxiliary electrically conductive film 5 after the removal of the sacrificial metal layer 21, so as to form the electrically conductive film 6 (the eleven-Bth step). Therefore, excess Ni—P alloy can be removed after the sacrificial metal film 21 is removed. In addition, Au can be substituted for the Ni—P alloy which has not been removed and remains finally on the surface, so that useless removal of Au can be prevented. Furthermore, as described above, the electrical conductivity of the contact 1 can be increased by forming the electrically conductive film 6 on the surface of the contact 1.

That is, according to the contact 1 of the present embodiment, plastic deformation (twinning deformation), which has occurred in the contact 1, can be recovered by heating to a temperature higher than or equal to the reverse martensite transformation temperature or unloading of the load due to contact between the contact 1 and the bump 15A or 15B. Therefore, an effect of preventing occurrence of permanent set of the contact 1 through permanent deformation due to repetition of the burn-in test can be exerted.

According to the method for manufacturing the contact 1 of the present embodiment, the contact 1 is formed by laminating the shape memory alloy film 3 having an excellent shape recovery property on the surface of the metal spring film 2 having a predetermined film thickness, and the shape memory alloy film 3 is patterned into a predetermined shape by using the sacrificial metal film 21. Therefore, an effect of producing the contact 1, which does not cause permanent set even when the burn-in test is repeated, can be exerted.

The present invention is not limited to the above-described embodiments and the like, and various modifications can be made, as necessary.

Figure 9:
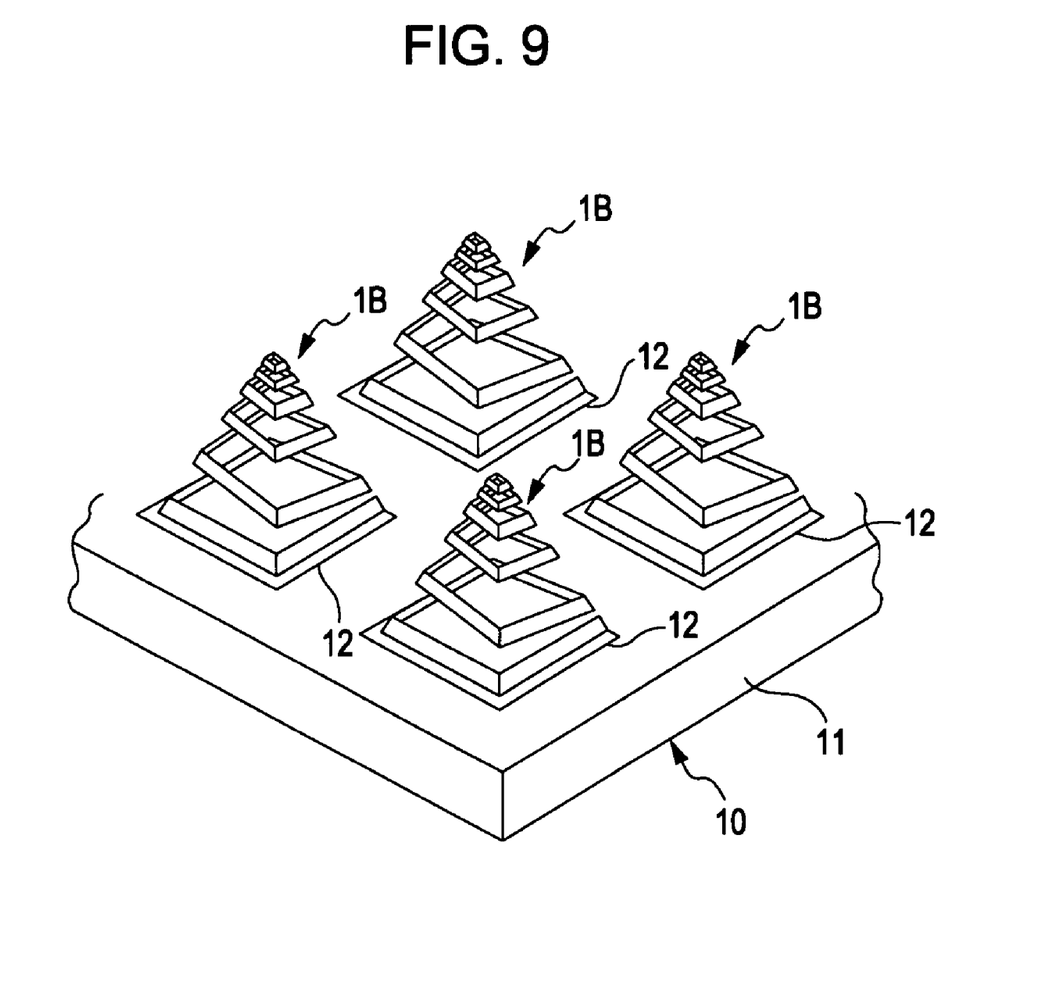
FIG. 9 is a perspective view showing a contact of another embodiment.

For example, the contact of the present invention is not limited to take the shape of a conical spiral, insofar as the contact is in the shape of a spiral in which the center portion is protruded. Therefore, in another embodiment, as shown in FIG. 9, the contact 1B may be formed into the shape of a polygonal spiral. At that time, preferably, a groove in the shape of a polygonal ring is patterned in the first step of the manufacturing method therefor, a resist cone in the shape of a polygonal cone is patterned in the second step, and the resist film is patterned with a groove in the shape of a polygonal cone spiral in the third step.

What is claimed is:

1. A contact comprising:
a metal spring film formed into the shape of a conical spiral or a pyramidal spiral; and
a shape memory alloy film which is disposed on an entire surface of the metal spring film, the entire surface being on an outer side of the conical or pyramidal shape, the shape memory alloy film having a martensite transformation temperature higher than room temperature and a reverse martensite transformation temperature lower than a test temperature of a burn-in test.

2. The contact according to claim 1,
wherein the metal spring film is formed of a Ni—X alloy, wherein X (is any one element selected from the group consisting of P, W, Mn, Ti, and Be).

3. The contact according to claim 1,
wherein the shape memory alloy film is formed of a TiNi alloy.

4. The contact according to claim 3,
wherein the composition of a Ti site in the TiNi alloy is 50.0 to 51.0 percent by mole.

5. The contact according to claim 1, further comprising:
a seed film laminated on an inner surface of the metal spring film, the seed film being formed of a Cu layer.

6. The contact according to claim 1, further comprising:
an auxiliary electrically conductive film laminated on a surface of the shape memory alloy film, the auxiliary electrically conductive film being made of a Ni—X alloy, wherein X is any one element selected from the group consisting of P, W, Mn, Ti, and Be.

* * * * *